United States Patent [19]

Stevenson

[11] 4,001,566
[45] Jan. 4, 1977

[54] FLOATING POINT CALCULATOR WITH RAM SHIFT REGISTER

[75] Inventor: George Earley Stevenson, Kircaldy, Scotland

[73] Assignee: Pico Electronics Limited, Glenrothes, Scotland

[22] Filed: Oct. 29, 1973

[21] Appl. No.: 410,363

Related U.S. Application Data

[63] Continuation of Ser. No. 165,908, July 26, 1971, abandoned.

[30] Foreign Application Priority Data

Mar. 19, 1971 United Kingdom ............... 7372/71

[52] U.S. Cl. .............................. 235/159; 235/156
[51] Int. Cl.² ......................................... G06F 7/52
[58] Field of Search .......... 235/156, 159, 160, 164, 235/168

[56] References Cited

UNITED STATES PATENTS

| | | |
|---|---|---|
| 3,037,701 | 6/1962 | Sierra ................................ 235/159 |
| 3,043,509 | 7/1962 | Brown et al. ...................... 235/156 |
| 3,193,669 | 7/1965 | Voltin ................................ 235/164 |
| 3,389,379 | 6/1968 | Erickson et al. ................ 340/172.5 |
| 3,523,161 | 8/1970 | Lewin ............................ 340/365 X |
| 3,760,171 | 9/1973 | An Wang et al. ................. 235/156 |

Primary Examiner—David H. Malzahn
Attorney, Agent, or Firm—Haseltine, Lake & Waters

[57] ABSTRACT

A calculator utilizing floating point logic by means of registers in the form of random access memories the bit positions of which are sequentially addressable, reversible timing means for addressing each register sequentially in either direction and programming means for causing numbers to be handled in said registers in the form of the exponent and mantissa of said numbers. The preferred embodiment of calculator also has control logic for said registers enabling bits to be displaced in said registers in a direction selected by said timing means for effecting the operations of multiplication and division by ten.

26 Claims, 14 Drawing Figures

|     | A |     |     |     |     |     |     |     |     |     |     | DP |     |     |     |     |     |     |     |     |
| --- | --- | --- | --- | --- | --- | --- | --- | --- | --- | --- | --- | --- | --- | --- | --- | --- | --- | --- | --- | --- |
|     | $T_{11}$ | $T_{12}$ | $T_0$ | $T_1$ | $T_2$ | $T_3$ | $T_4$ | $T_5$ | $T_6$ | $T_7$ | $T_8$ | $T_0$ | $T_1$ | $T_2$ | $T_3$ | $T_4$ | $T_5$ | $T_6$ | $T_7$ | $T_8$ |
| (a) | 0 | 0 | 0 | 0 | 0 | 0 | 0 | 0 | 0 | 0 | 0 | 0 | 0 | 0 | 0 | 0 | 0 | 0 | 0 | 1 |
| (b) | 0 | 0 | 0 | 0 | 0 | 0 | 0 | 0 | 0 | 0 | 0 | 0 | 0 | 0 | 0 | 0 | 0 | 0 | 1 | 0 |
| (c) | 0 | 0 | 0 | 0 | 0 | 0 | 0 | 0 | 0 | 0 | 2 | 0 | 0 | 0 | 0 | 0 | 0 | 1 | 0 | 0 |
| (d) | 9 | 2 | 2 | 0 | 0 | 0 | 0 | 0 | 0 | 0 | 0 | 0 | 0 | 0 | 0 | 0 | 0 | 1 | 0 | 0 |
| (e) | 9 | 8 | 2 | 0 | 0 | 0 | 0 | 0 | 0 | 0 | 0 | 1 | 0 | 0 | 0 | 0 | 0 | 0 | 0 | 0 |
| (f) | 9 | 8 | 0 | 2 | 0 | 0 | 0 | 0 | 0 | 0 | 0 | 0 | 1 | 0 | 0 | 0 | 0 | 0 | 0 | 0 |
| (g) | 9 | 9 | 0 | 2 | 0 | 0 | 0 | 0 | 0 | 0 | 0 | 0 | 1 | 0 | 0 | 0 | 0 | 0 | 0 | 0 |
| (h) | 0 | 0 | 0 | 0 | 0 | 2 | 0 | 0 | 0 | 0 | 0 | 0 | 1 | 0 | 0 | 0 | 0 | 0 | 0 | 0 |
| (i) | 0 | 0 | 0 | 0 | 0 | 0 | 0 | 0 | 0 | 3 | 0 | 0 | 0 | 0 | 0 | 0 | 0 | 0 | 0 | 0 |
| (j) | 0 | 0 | 0 | 0 | 0 | 0 | 0 | 0 | 0 | 3 | 0 | 0 | 0 | 0 | 0 | 0 | 0 | 0 | 0 | 1 |
| (k) | 0 | 1 | 0 | 3 | 0 | 0 | 0 | 0 | 0 | 0 | 0 | 0 | 1 | 0 | 0 | 0 | 0 | 0 | 0 | 0 |

FIG.13

FLOATING POINT CALCULATOR WITH RAM SHIFT REGISTER

OTHER APPLICATIONS

This application is a continuation of application Ser. No. 165,908 filed July 26, 1971 and now abandoned.

BACKGROUND OF THE INVENTION

This invention relates to calculators and is pertinent particularly to desk and pocket calculators.

Present electronic desk calculators utilize fixed point logic in their calculations but this gives the disadvantage of a limited number of decimal places with any one calculation so that data, often affecting significant digits of a computation, can be lost during a calculation. This disadvantage is partially overcome in large calculators, which can contain a sufficient number of components to deal with a large number of bit positions. However, such calculators are expensive and lose the ease of portability of the smaller calculators.

It is an object of the invention to provide a calculator which avoids computation by fixed point logic and the disadvantages of such logic.

SUMMARY OF THE INVENTION

According to the invention, a calculator comprises an arithmetic unit, a plurality of numeral-storage registers which are sequentially addressable random-access memories, reversible-direction timing means for sequentially addressing the bit positions of each of said registers, a number routing arrangement for directing numbers between said registers and said arithmetic unit, and a programming arrangement operable to cause said registers to store, and manipulate in conjunction with the routing arrangement and the arithmetic unit, numerical data in the form of the mantissa and exponent of a number, the storage capacity in each of said registers for the exponent corresponding to a plurality of decades of the stored number in excess of the number of storable decades of the mantissa.

The type and operation of said registers enables floating point logic to be employed for storage and computation, so that numbers with a large exponent, positive or negative, can be handled without loss of digits of the mantissa up to the extent of the mantissa storage capacity. For example, with a two-digit exponent capacity, numbers up to ninety-nine decades can be processed, e.g. numbers from $1.0 \times 10^{-20}$ to $9.99 \times 10^{79}$. This applies not only to the supplied numbers and the final answers but also to intermediate answers. Moreover, calculation can be facilitated by the use of random access memories and reversible timing means, enabling digit locations to be supplied with data independently of each other and the digits to be moved from between locations in either direction. Thus, preferably, there is control logic enabling a digit to be read from one digit position and written back into one of the two adjacent positions, depending upon the operating direction of the timing means, to produce mantissa multiplication and division by ten. With shift register storage this multiplying and dividing facility could only be provided with a considerable increase in logic. This is very relevant to the preferred embodiment implemented in integrated form, in which space is at a premium.

Advantageously, an additional, decimal point, register, of random access form and sequentially addressed by the timing means, is provided for decimal point position storage, this additional register being used with one of the other registers in an output mode to deliver the content of that one register in fixed-point fashion. Said one register may be used for input and output of data, one of the other numerical-storage registers retaining the data in floating point form. The decimal point register may also have control logic for transferring data from one digit position to an adjacent position.

The registers may be of dynamic form with control logic for recirculating digits to reinforce the data.

Advantageously, the registers, the arithmetic unit, the routing arrangement, the timing means and the programming arrangement, are in integrated form, preferably on a single semiconductor chip. In a preferred embodiment, the active devices of the integrated circuits are insulated-gate field-effect (IGFET) devices in which the above-mentioned dynamic registers can be implemented conveniently with three active devices only per bit of storage, these being a storage device, a writing device and a reading device.

The programming arrangement may take the form of a read-only memory which is readily formed of IGFET devices in an integrated-circuit, with '1' and '0' bits stored by the presence and absence of gate electrodes of a matrix of IGFET devices. The memory defines a plurality of addresses at which bits are stored defining operations, e.g. operations in the routing logic, relating to the respective addresses. One significant feature of a preferred memory is a self-addressing arrangement which enables the programming arrangement to step itself through a sequence of appropriate addresses when a piece of data has been entered into the calculator. For this purpose, the memory has a section defining at a plurality of memory addresses 'next addresses' to which the memory is to be directed via the self-addressing arrangement. In the preferred memory, there is facility for defining two alternative next addresses and for defining test signals for initiating tests in test logic of the calculator to determine which of the two next addresses is to be effective. Accordingly, a particular memory address can be used during each of two distinct operations. This considerably reduces the number of memory addresses required, and, as will be apparent, this is particularly significant when implementing the invention in integrated form in view of the space saving effect. The test logic is designed to test signals determined by input data and instructions and by the states at digit positions in the registers and to select a next address according to those signals. The test logic also contains bistable circuits supplying further of these signals. At least some of the bistable circuits are set and reset by signals generated by some of the memory addresses. One or more of the bistable circuits may be set and reset by input data.

One further facility provided by the preferred embodiment is a "constant" mode in which a stored number may be held as a constant value for repetitive use in calculations. One of said bistable circuits of the test logic might be operated by a constant input instruction to cause programme addresses appropriate to this mode to be selected. The constant number is utilised by the calculator as if it were the last of two numbers entered for a calculation, e.g. in division the "constant" number is the divisor. The number, which itself might have been formed as an answer, can also be used as a dividend if required by cancelling the constant mode, when the number is treated by the calculator as a first number entered. This facility is achieved in that the register allocated by the programming arrangement for holding the number Y for a calculation such as X ÷ Y or X − Y, when Y is normally the second of the numbers entered, will be caused in the constant mode to hold the "constant number", whilst the number entered to be arithmetically combined with the constant number already stored in the calculator will be allocated to the register which would normally contain X, i.e. the number normally first entered. By setting up a constant mode, then, the functions of two registers are reversed by the programming arrangement for a particular calculation. However, the two registers involved are not necessarily the same two for each arithmetic operation. Moreover, after a calculation, the constant number is still stored in one of the registers for further computation, whilst in other modes only the last-formed answer need be stored.

It is also to be noted that these facilities can be provided with only three numerical storage registers and one decimal point register.

It has already been mentioned that the calculator circuit can be formed on a single semiconductor substrate, particularly with IGFET devices. In this connection a significant topological arrangement of the circuit is employed in the preferred embodiment. In this arrangement, a matrix-like array of signal paths is employed, more particularly, the timing or addressing signals from the timing means flow through the registers to the test logic substantially at right angles to the data flow from the registers through the routing logic to the arithmetic unit. Moreover, control signals flow from the read-only memory to the routing logic substantially at right angles to said data flow, whilst other memory signals flow from the memory to the test logic substantially at right angles to the timing signals and the control signals. A tapering form to the memory enables signals to be emitted from parallel signal paths of the memory at right angles to one another. The crossing paths of signal flows are achieved in IGFET devices by parallel strips of diffused source and drain regions and overlying conductors.

For a better understanding of the invention and to show how the same may be carried into effect, reference will now be made, by way of example, to the accompanying drawings, in which:

FIGS. 13 and 14 are diagrams showing successive operating conditions of the registers of the calculator.

FIG. 1 illustrates in perspective a desk calculator the computation circuits of which are defined by an integrated circuit of insulated-gate field-effect (IGFET) devices on a single piece of semiconductor shown in schematic form in FIG. 3.

Figure 1:
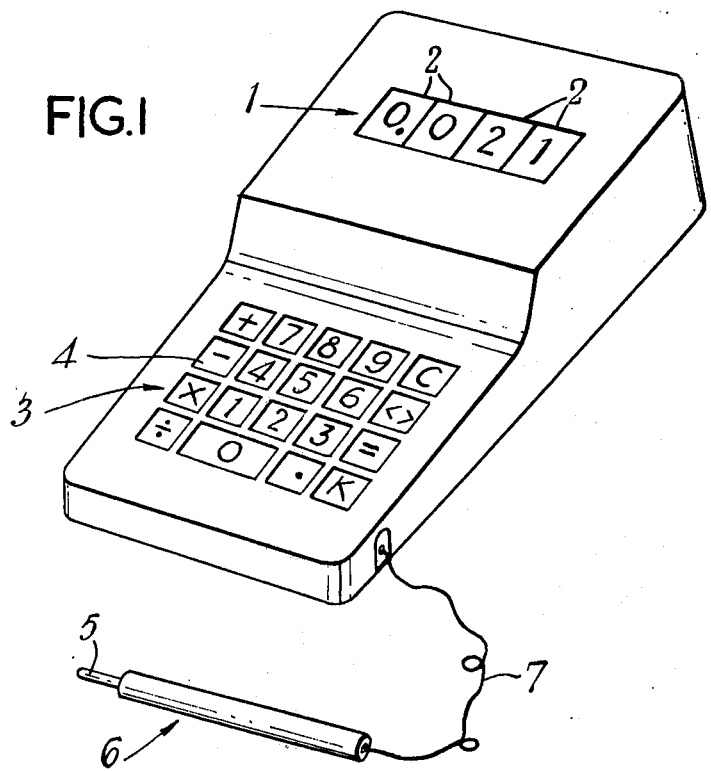
FIG. 1 is a perspective view of a desk calculator.

The calculator has a display 1 consisting of four seven-bar display lamps 2 each capable of indicating any one of the numerals 0 to 9, together with a decimal point as illustrated for the first of the lamps and a minus sign.

The calculator also has an actuator panel formed in the manner of a keyboard in that it comprises an array 3 of zones each to be contacted to feed in data to the calculator. The zones are constituted by respective conductive pads 4 each having a character or command indication according to the data which the pad is intended to feed into the calculator.

The pads 4 are intended to be electrically-conductively contacted by the conductive tip 5 of a stylus 6 connected by a wire 7 to the circuitry within the calculator.

Figure 2:
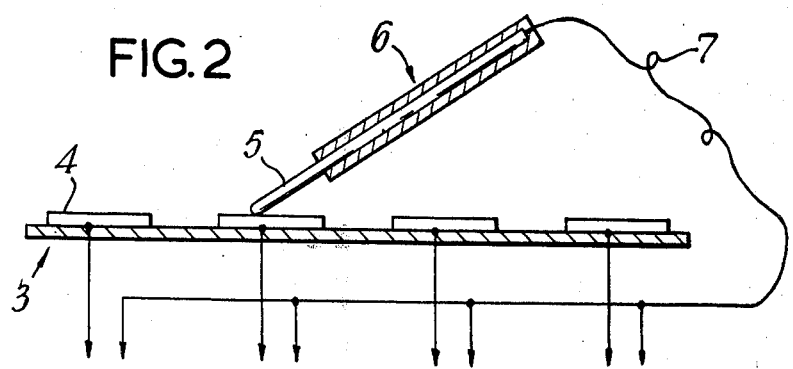
FIG. 2 is a diagrammatic sectional view of an actuator panel of the calculator of FIG. 1.

FIG. 2 is a sectional and diagrammatic view of the array 3 and shows that the pads 4 are mounted on an insulating support through which conductors 8 extend to the circuitry of the calculator. It will be apparent that the stylus 6 and the array of pads 4 provide a single-pole multi-way switch giving the same end result as a keyboard the keys of which are coupled to distinct electrical switches, but with a cost saving compared with a conventional keyboard.

The facilities provided by this calculator will now be described. An important facility is that calculations can be effected merely by contacting the pads 4 logically according to the arithmetical operations required. As a simple example, if one wished to calculate 2.5 ÷ 5 × 3 + 1, the pads 4 would be contacted in the arithmetic sequence: (2), (.),(5),(÷),(5),(X),(3),(+), (1), and (=). The display 1 would then give the indication "2.500". This enables successive chain calculations to be performed smoothly without having to arrive at intermediate answers. It will be observed that it is not necessary to contact the decimal point pad (.) having contacted the pad (5) for the second time in order to indicate the value 5.0 instead of, say, 0.5. The calculator will recognise the correct position of the decimal point when no further numbers are fed in.

Another facility is that the display can be caused by contacting pad (<>) to display the next less significant group of four digits of an answer, so that the display is capable of giving an answer to eight significant digits. In the above example, when the key (<>) is contacted, the display will read "0.0.0.0.", the decimal points being included to indicate that the display relates to the least significant digits at the right-hand side of the decimal point.

A further facility is that provided by pad (C) which clears the display without erasing the result of the last calculation from the memory of the calculator; thus if the pads are contacted after the above calculation in the sequence (C), (+), (2), (=), the display will indicate the value "4.500". The memory will be cleared however should one commence a new calculation (by contacting one of the numeral or decimal point pads) after contacting the pad (C).

An additional facility is provided by the pad (K) which causes an entered number, or the last formed answer, to be held as a constant for use in a subsequent calculation. For example, if the value "2" has been entered or formed in the machine, addition, subtraction, multiplication and division can be performed with the value 2 once the pad (K) has been contacted. For example, if then the sequence (8) (÷) is followed the answer "4" will be obtained; if, say, the pad (X) is then contacted the answer 4 will be multiplied by the constant value to give "8". Similarly, powers of the constant value can be formed by contacting the pad (X) an appropriate number of times.

Although only positive numbers can be fed to the calculator, its logic can cope with any subsequent negative or positive signs generated during a calculation and can display the minus sign when it occurs in an answer.

The logic of the calculator operates in the floating point mode for which it handles numbers in the form of the mantissa and the exponent of the number. By using this mode, the calculator can represent and handle numbers from $1.0000000 \times 10^{-20}$ to $9.9999999 \times 10^{-79}$. Moreover, the calculator will retain the eight most significant digits of the mantissa. For example, if 2 is divided by $1 \times 10^{-15}$, the display will show the value "0.0000000" but the calculator does not lose the mantissa such that if one were then to multiply the "answer" 0.0000000 by $10^{14}$, say, the correct answer of "0.2000000" would still be achieved. In calculations employing a fixed point mode, the digit 2 would be lost and the final answer would be zero, unless one were prepared to provide considerably more storage capacity than that required in the present case.

The data within the calculator is stored as an eight digit mantissa and a two digit exponent with a separating single digit guard position, so that the total stored word length is 11 digits. Each digit is represented by a four bit binary coded decimal code. Negative numbers are stored in 10's complement form, and are recognised by the digit 8 or 9 (easily recognised in BCD) in the guard position or, for a negative index, in the $T_{I1}$ position. The floating point logic used in such that all four functions (addition, subtraction, multiplication and division) are performed on the mantissa and only operations of addition and subtraction are performed on the exponent. The single digit guard is used for accumulating carries which are generated within the mantissa; thus where carries create a nine digit number, the ninth digit is generated in the guard slot, then the exponent is modified and the mantissa restored to eight digits by dividing by 10.

The routines for addition and subtraction are substantially the same. First of all the exponents are manipulated until the two numbers have an equal exponent. This is done by bringing the smaller exponent up in value to equal the larger exponent. This means that the two numbers have mantissas of the same significance, so that the mantissas can then be added or subtracted freely.

In multiplication, the exponents are added together after which the mantissas are multiplied by repeated addition. In the process of multiplication a 16 digit mantissa product is formed and at the end of the operation the least significant eight digits of the product are discarded. The 16 digit mantissa is stored in two registers.

In division, the exponents are subtracted and the mantissas are divided by repeated subtraction. In this case additional 0's are brought into the dividend so that total accuracy is maintained.

A particular feature of the calculator is the ease with which numbers can be scaled in multiples of ten. Arithmetically, this is achieved by shifting the mantissa, a one place shift in one direction being equivalent to dividing by 10 and a one piece shift in the other direction being equivalent to multiplying by ten. It is, of course, necessary to correct the exponent by adding or subtracting 1 as necessary.

Figure 3:
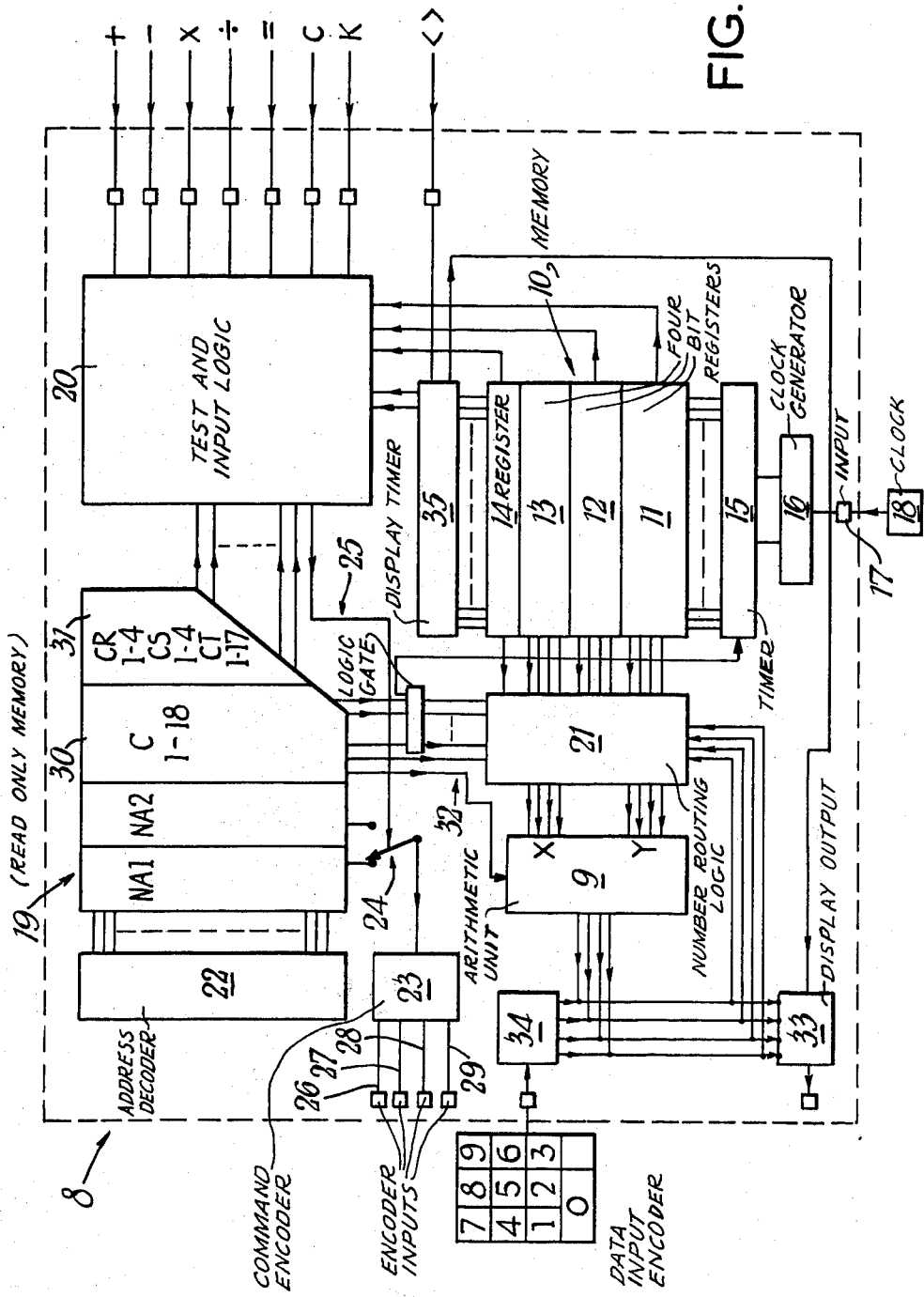
FIG. 3 is a schematic diagram showing the arrangement of circuit parts of an integrated circuit included in the desk calculator of FIG. 1.

With reference now to FIG. 3, the circuits included in the single integrated circuit 8 as illustrated comprise an arithmetic unit 9 which performs both addition and subtraction in pure binary code without recourse to further complementary arithmetic. The code correction for restoring to binary coded decimal, as used elsewhere in the calculator, is also performed within the arithmetic unit.

The data within the calculator is stored in a sequential addressed memory arrangement 10 which comprises three four-bit registers 11, 12 and 13 each of eleven digits capacity or length, together with a one-bit register 14 of nine digits capacity or length. The three four-bit registers 11, 12 and 13 are used to store the mantissa and exponent of the numbers used within the calculator. The fourth register 14 contains data defining the decimal point location. The register 11 (rereferred to herein as the A register) is used to hold the information being displayed. The displayed information is shown with the exponent equal to zero and the mantissa scaled accordingly. The register 13 (the C register) is used to hold the data being displayed but to hold it in the floating point form, i.e. as a mantissa and exponent. The register 12 (the B register) is used either to hold a previous answer, or the CONSTANT number if the calculator is being used in the CONSTANT mode. The decimal point register 14 is merely used as a position representative register so that a 1 represents the position of the decimal point.

The sequentially provided addresses for the registers or memories 11 to 14 are generated by a reversible-direction system timer 15 controlled by phases $\phi_1$ and $\phi_3$ of a four-phase ($\phi_1$ and $\phi_4$) clock generator 16 connected to an input 17 to receive clock pulses from a clock 18 outside of the chip. The timer is a 12-bit counter which generates the 11 address locations $T_{I1}$, $T_{I2}$ and $T_0$ to $T_8$ plus an additional bit which is used to define a blank time period $T_B$.

Control of the calculator is achieved by a read-only memory 19, test and input logic 20 and number routing logic 21. The read-only memory 19 is organised to be self-sequencing so that once the programme is initiated the read-only memory will sequence itself during the various programme steps, the path taken through the sequence being determined by the positive or negative result of various test decisions effected by the test logic 20 on demand of the read-only memory. The read-only memory will then determine the next operation according to whether the test result is positive or negative.

The read-only memory has an address decoder 22 which will actuate the rows of the read-only memory according to the seven-bit address designations supplied to it by a command encoder 23. To achieve self-sequencing of the memory, the command encoder 23 is connected to a change-over device 24 connecting the encoder 23 to either of two sections NA1 and NA2 of the memory depending upon whether or not a positive or negative test result is supplied on a conductor 25 from the test logic 20. The sections NA1 and NA2 store respective next addresses at most of the rows of the memory 19. Thus, the selection of one address or row of the memory 19 by decoder 22 will automatically set up at the outputs of the sections NA1 and NA2 two addresses either of which is available to define the next address selected, the choice between the two addresses being made by the test logic 20.

This self-sequencing action will be overridden by the encoder 23 when ever any one of its four inputs 26, 27, 28 and 29 is energised, which forces the decoder 22 to select the corresponding one of four predetermined addresses.

The inputs 26 to 29 are connected to the actuator panel so that they are energised by the contacting respectively of the pad (C), the decimal point pad, any one of the numbered pads and, fourthly, any one of the other pads, i.e. a command pad.

The read-only memory 19 has further sections 30 and 31. The section 30 provides control signals $C_1$ to $C_{18}$ on lines 32 for the routing logic to determine the passage of data between the register, the arithmetic unit 9, a display output device 33 connected to the lamps 2 and a data input encoder 34 coupled to the actuator panel. The section 31 provides control signals $CR_1$ to $CR_4$, $CS_1$ to $CS_4$ and $CT_1$ to $CT_{17}$ for the test logic 20. The signals CR and CS are used, respectively, to reset and set a number of bistable circuits of the test logic 20 and signals CT are signals which initiate tests in the test logic.

Certain of the signals on lines 32 pass to an arrangement 93 of logic gates to produce control signals C' in dependence upon certain outputs of the timer 15. The signals C' are defined hereinafter by logic equations which define the arrangement of the logic gates. The signals C' are: $C_2'$, $C_3'$, $C_4'$, $C_7'$, $C_{16}'$ and $C_{17}'$.

To conclude this description of the main components of FIG. 3, reference will briefly be made to the display output device 33 which supplies the lamps 2 with signals corresponding to the stored number data. These seven-bar lamps are operated, according to their manufacturers instructions, in an on-off fashion at such a frequency that the eye sees a continuous display. To achieve this mode of operation, the display output device is switched by a display timer 35 which itself is controlled by the timing signals from the timer 15. The design of this display timer will depend upon the lamp manufacturer's specification for the lamps and it will not be described further as its implementation could be effected by one skilled in this art and as its features are not relevant to the present invention except for the feature that the display timer 35 is physically disposed directly in the flow path of timing signals from the timer 15.

As described so far with reference to FIG. 3, the integrated circuit of the calculator will be seen to have several significant features.

Firstly, the use of sequentially addressed random access memories for the registers enables the functions of scaling and of multiplying and dividing by 10 to be achieved with an economy of elements which could not be achieved with shift registers. A shift register requires more elements per bit than a random access memory and would require more complex control circuits to achieve the bidirectional shift used in the present embodiment for multiplication and division by 10. Such an economy is of prime importance in implementing circuitry in the form of a single integrated circuit.

Secondly, the layout of the circuits on the integrated circuit chip of FIG. 3 has been designed specifically for ease of conveying timing control and data signals about the circuits with a minimum utilisation of space. In this respect, attention is drawn to the matrix-type flow of timing signals from the timer 15 through the registers 11 to 14 and the display timer 35 to the test logic 20 at right angles to the data flow from the registers 11 to 14 and at right angles to the flow of control signals from section 31 of the read-only memory 19. The tapered form of section 31 enables the control signals, normally directed parallel to the timing signals, to be emitted at right angles to the timing signals. A similar matrix form of signal flow arrangement is to be seen with the control signals from section 30 and the data from the registers 11 to 14.

Individual parts of FIG. 3 will now be described in more detail.

Figure 4:
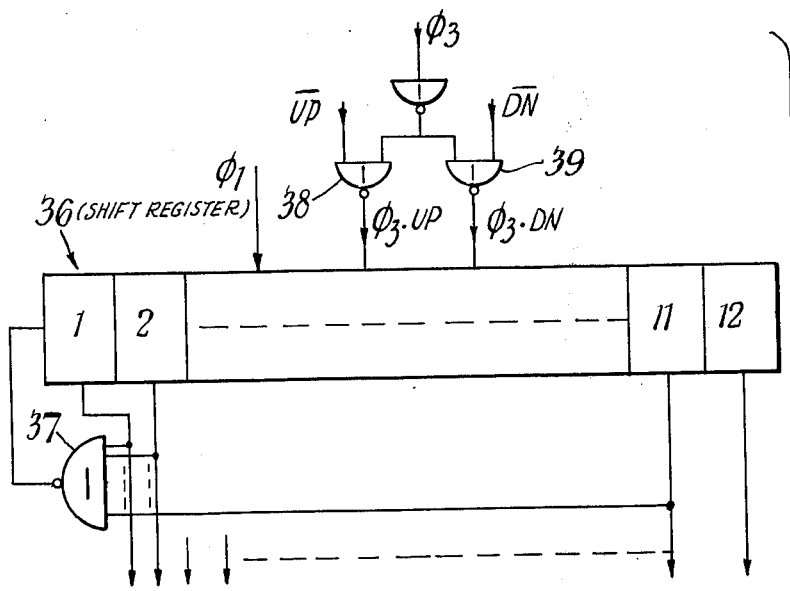
FIG. 4 shows in block diagram and circuit form a system timer of the calculator.
Figure 4:
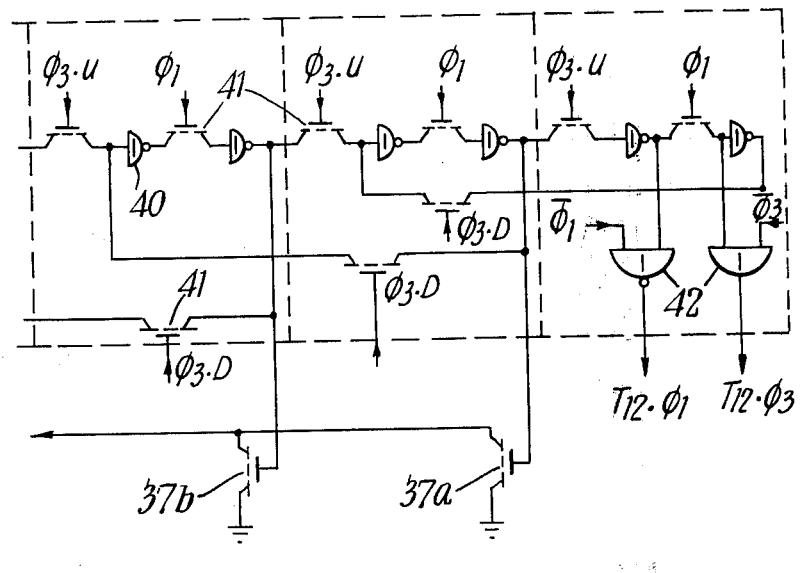

FIG. 4 is a diagram of the system timer 15, the upper part of the figure showing a block diagram of the timer 15 and the lower part of the figure showing the circuit of the final three stages of the timer 15. This timer is, basically, a reversible 12 stage shift register 36 having feed-back via a NOR gate 37. The register 36 has three clock inputs, one for $\phi_1$ from clock generator 16 and two both for $\phi_3$ from clock generator 16, one of these two receiving a signal $\phi_3$.UP from a NOR gate 38 and the other receiving a signal $\phi_3$.DN from a NOR gate 39. It will be seen that the shift register receives the signal $\phi_3$.UP when a signal UP is created in the calculator and this signal will cause the register to transmit a bit 1 in the up direction from stage 1 to stage 12 of the register. When a signal DN is created in the calculator, signal $\phi_3$.DN is received and causes the register to operate in the reverse, down, direction.

The lower part of FIG. 4 shows the implementation of the shift register 36 with NOR gates 40, each formed of two IGFET devices, and switching devices 41, each of which is an IGFET device. Elements 37a and 37b of the NOR gate 37 are also shown. Output gates 42 take two outputs from each stage, one in $\phi_1$ time and the other in $\phi_3$ time, but for clarity in FIG. 4 only the gates of the final stage are shown.

The register 36 divides the clock phase $\phi_1$ by 12, thereby generating 12 equal time intervals. These intervals are in three groups, $T_B$, $T_M$ and $T_I$. $T_B$ is a single time interval and defines the starting time for all conditions within the system, but, particularly it defines the time at which the read-only memory 19 changes to its next address, so that all programme steps are measured from $T_B$ to $T_B$. $T_M$ is a group which consists of the nine intervals $T_0$ to $T_8$, in which intervals the timer addresses, respectively, the guard digit and the eight mantissa digits of the registers 11, 12 and 13. In these intervals, the timer also addresses the nine places of the register 14. The group $T_I$ consists of the time intervals $T_{I1}$ and $T_{I2}$ in which the respective index places of the registers 11, 12 and 13 are addressed.

In the normal DOWN mode, the timer is decrementing, i.e. it addresses the registers 11, 12 and 13 in the sequence $T_B$, $T_8$ to $T_0$, $T_{I2}$ and $T_{I1}$. However, as the direction of the timer can be reversed so that it increments, the sequence $T_B$, $T_{I1}$, $T_{I2}$ and $T_0$ to $T_8$ can be selected.

An additional pulse $T_P$ is generated by the test logic under the control of the timer, 15, $T_P$ being a single pulse occurring only when any of the pads 4 is contacted, $T_P$ beginning before $T_B$ and ending after $T_B$.

Figure 5:
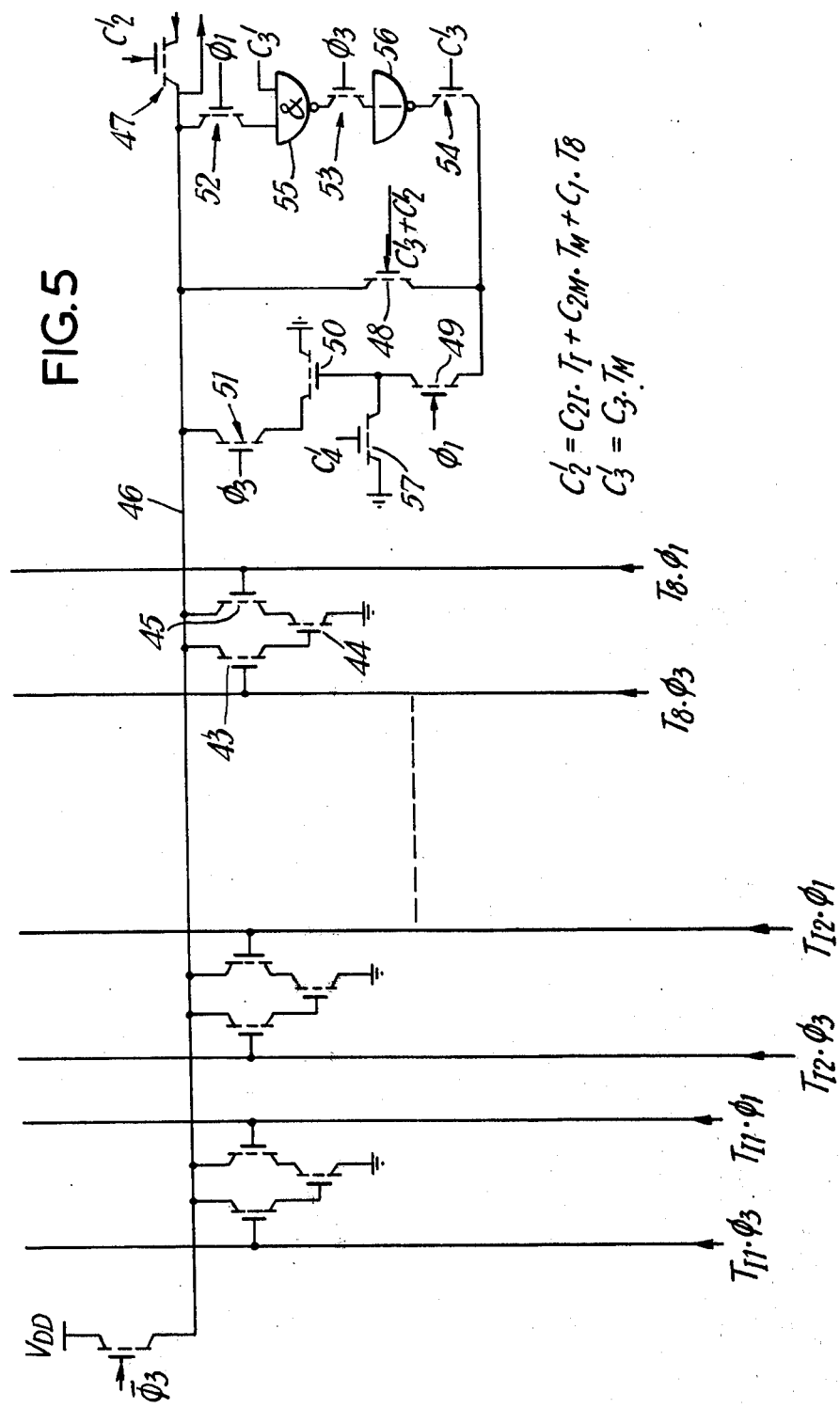
FIG. 5 is a circuit diagram of a portion of a register of the calculator.

FIG. 5 shows the basic form of the registers 11 to 14. This figure illustrates some of the outputs of the timer 15 and shows how they are coupled in matrix form to bit positions of the registers. In fact FIG. 5 illustrates a portion of the A register 11 with its control logic.

Each bit of the register comprises three IGFET devices 43, 44 and 45. Devices 43 and 45 act as switches which are opened in $\phi_3$ and $\phi_1$ times respectively for write and read operations. Device 44 is a storage device which stores a bit dynamically at its gate capacitance and is connected by devices 43 and 45 to a data line 46 connected to the routing logic 21; FIG. 5 shows a switch 47 of the routing logic 21. Line 46 is of course one of four such lines for the four BCD bits of the register. As dynamic storage is employed, the stored data must be continually reinforced, except when data change is required. For this purpose, there is a recirculating data loop consisting of IGFET devices 48 to 51. For multiplication or division a branch is provided consisting of IGFET devices 52 to 54, NOR gate 55 and inverter 56. Data stored at device 50 can be destroyed by way of an IGFET device 57.

This control logic 48 to 57 is operated by signals $\phi_1, \phi_3$, $C_2'$ and $C_3'$, where $C_2'$ and $C_3'$ are functions of the control signals $C_2$ and $C_3$ from memory section 30 and are defined logically as follows:

$$C_2' = C_{2I}.T_I + C_{2M}.T_M + C_1.T_8$$

$$C_3' = C_3.T_M.$$

The signals $C_{2I}$ and $C_{2M}$ are two forms of the signal hereinbefore referred to simply as $C_2$, $C_{2I}$ being a control signal relating to the exponent of a number and $C_{2M}$ being a control signal relating to the mantissa. $C_{2I}$ and $C_{2M}$ are supplied to allow data flow from the arithmetic unit 9 to the exponent and mantissa portions, respectively, of the A register 11. $C_3$ is supplied to cause the content of the A register to be multiplied or divided by ten.

When neither $C_2$ nor $C_3$ is present, data recirculation occurs through the open device 48. In $\phi_1$ time, devices 45 and 49 are open and transfer the data at device 44 in inverted form to device 50. In $\phi_3$ time, devices 51 and 43 open to transfer the data from device 50, inverted again, to the gate of device 44. In this way each bit of storage is reinforced once in each cycle from $T_B$ to $T_B$ time.

When $C_2'$ exists, device 47 is opened and, in $\phi_3$ time, data from the routing logic is supplied to line 46 and via device 47 to the device 44, thereby writing new data into a bit position. Any data existing at device 50 is erased by the opened device 57.

Multiplication and division by ten is effected by producing control signal $C_3$ which causes data from one bit position to move to the next, the direction depending upon the direction of counting of the timer 15. This operation is carried out only on the mantissa, so that $C_3$ is used only in $T_M$ time, i.e. $C_3$ is supplied to the A register in the form $C_3' = C_3.T_M$. Control signal $C_3'$ closes the device 48 and opens NAND gate 55. In $\phi_1$ time, therefore a bit passes from a bit position of the register to line 46 and through device 52 to NAND gate 55. In the subsequent $\phi_3$ time, the bit is delivered to and stored at the inverter 56. After a further $\phi_1$ and $\phi_3$ time sequence, the bit is returned to line 46, but by then the position from which it came is closed and an adjacent position open to receive the bit via its now open device 43. Accordingly the bit is shifted by one position in the register, the direction of shift depending upon the direction in which the timer 15 is operating. A zero is put into the $T_O$ or $T_8$ position, depending upon the direction of operation of the timer.

Figure 6:
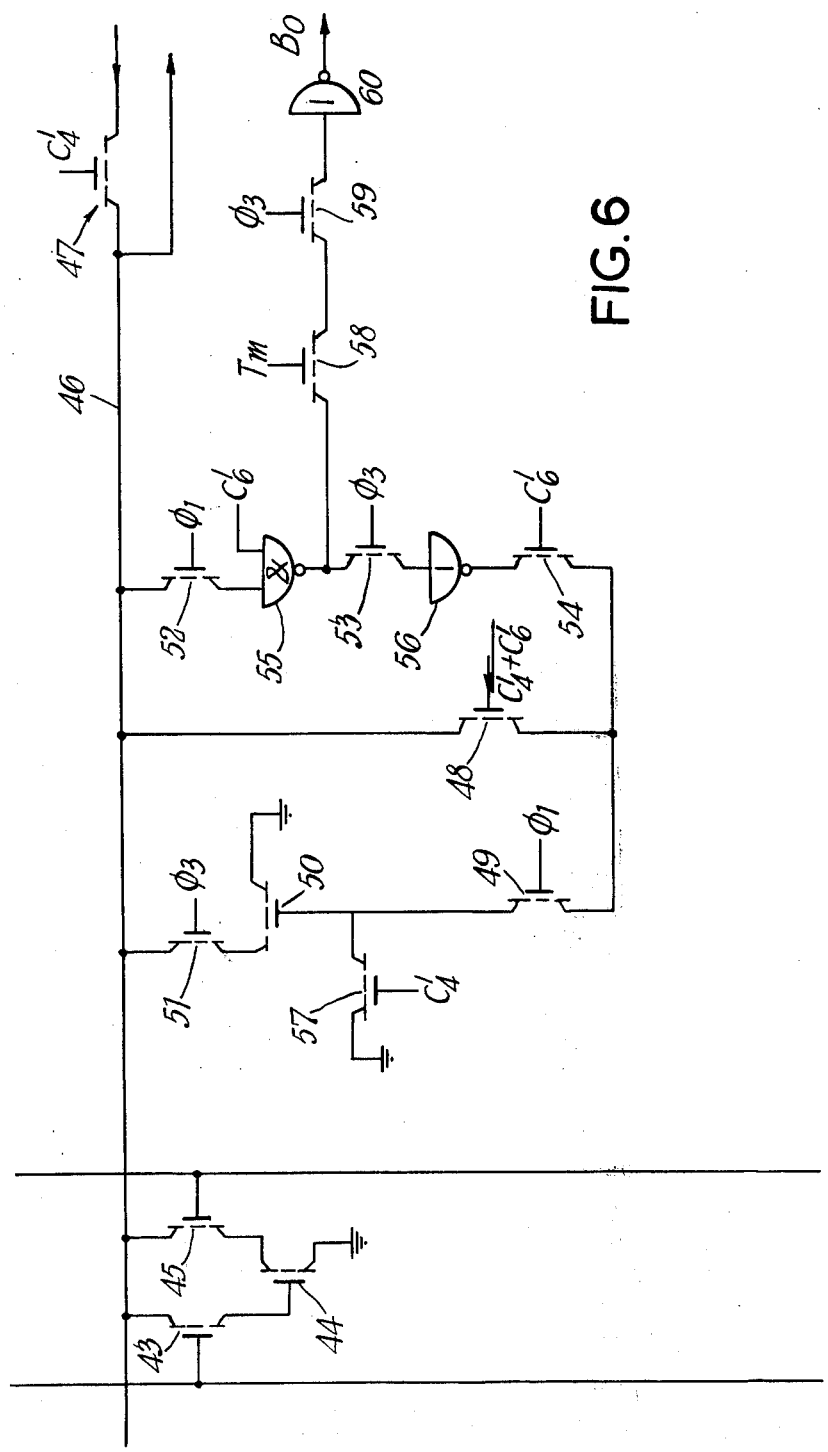
FIGS. 6 to 8 are respective circuit diagrams of portions of three other registers of the calculator.

FIG. 6 illustrates the corresponding control logic of B register 12 of which only a single bit position is illustrated. Like elements have been given the same references. It will be apparent that the B register has the same facilities as the A register. In addition it has an output $B_O$ connected to the NAND gate 55 by IGFET devices 58 and 59 and an inverter 60. Output $B_O$ enables data to overflow into the A register during multiplication operations for temporary sixteen digit storage.

The B register is controlled by control signals $C_4'$ and $C_6'$ defined as follows:

$$C_4' = C_{4I}.T_I + C_{4M}.T_M$$

$$C_6' = C_6.T_M.$$

As for signal $C_2$, signal $C_4$ is in fact delivered as two signals $C_{4I}$ and $C_{4I}$ pertaining respectively to the exponent and mantissa of the number stored in the B register.

Figure 7:
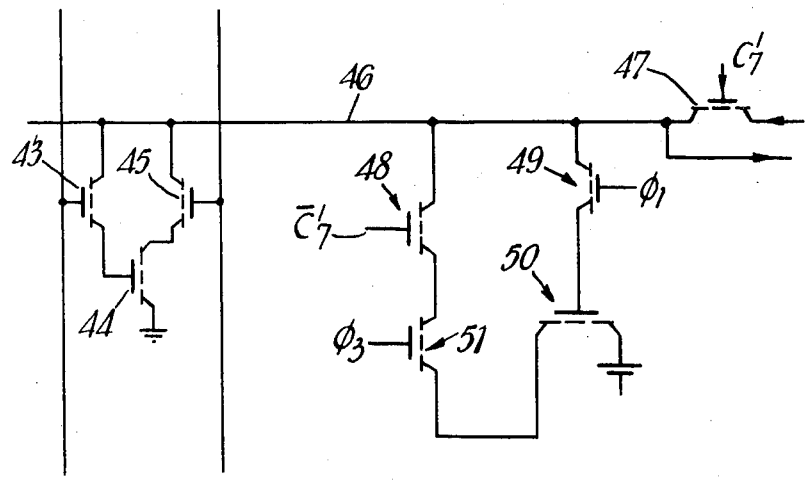

The C register 13 is illustrated in FIG. 7 by one of its bit positions and its control logic. In this case, only the data recirculating loop 48 to 51 is provided. $C_7$ is the relevant control signal and is delivered in the form $C_7'$, where $C_7' = C_7 + C_{7M}.T_M$. The control signal $C_7$ is in fact supplied as two signals $C_7$, relating to the whole register, and $C_{7M}$ relating only to the mantissa storage portion of the register.

Figure 8:
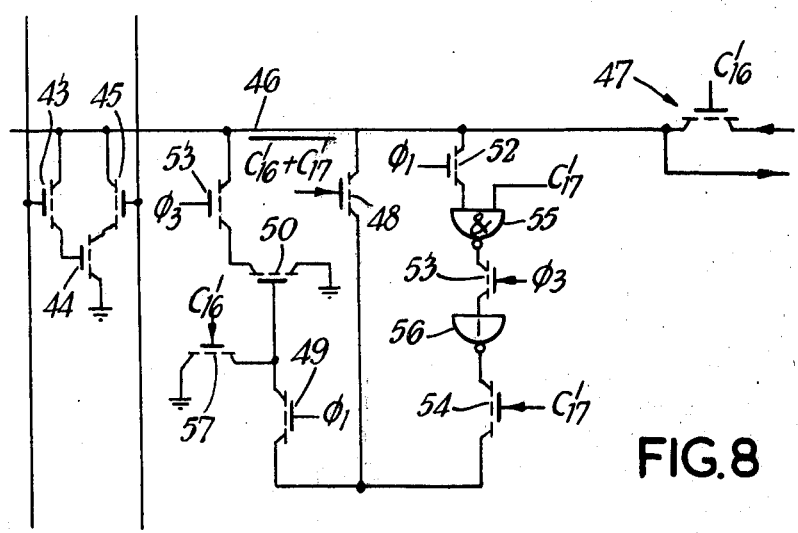

FIG. 8 shows the control logic and one bit position of the decimal point register 14. This register has the same control logic as A register 11, but differs in that it has only nine digit storage positions with only one bit per digit. This register 14 is controlled by control signals $C_{16}'$ and $C_{17}'$ formed as follows:

$$C_{16}' = C_{16}.T_M$$

$$C_{17}' = C_{17}.T_M.$$

Figure 9:
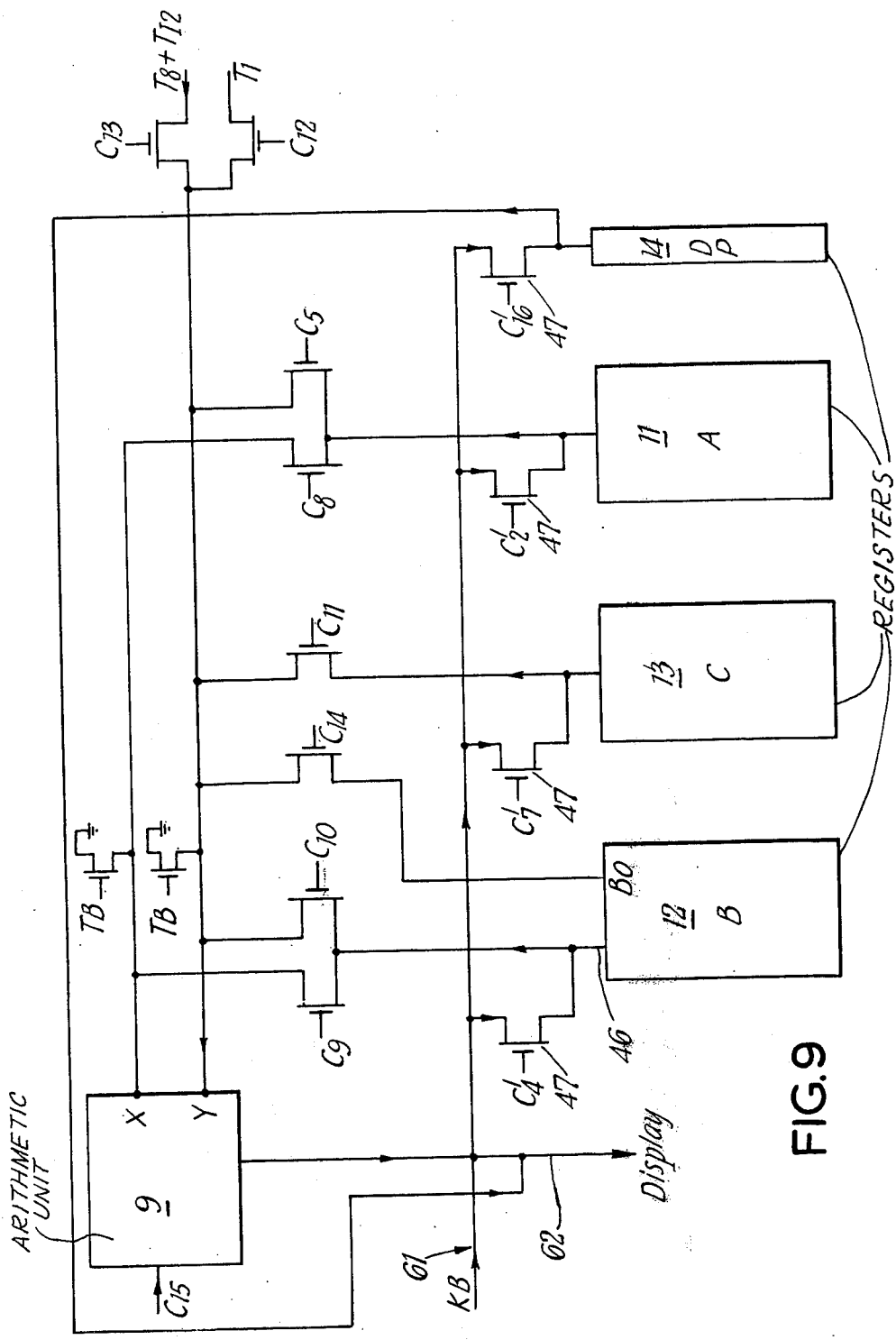
FIG. 9 shows routing logic of the calculator.

The routing logic is shown in FIG. 9 in association with the registers 11 to 14 and the arithmetic unit 9. The devices 47 are shown together with a plurality of other IGFET devices controlled by the control signals $C_1$ to $C_{18}$. To assist in understanding the operation of the routing logic, the functions of the control signals will now be set out.

$C_1$ enables data to be input from the actuator panel;

$C_{2I}$ and $C_{2M}$ allow data to flow from the arithmetic unit 9 to the A register 11;

$C_3$ causes the contents of the A register 11 to be multiplied or divided by 10;

$C_{4I}$ and $C_{4M}$ enable data to pass between the arithmetic unit 9 and the B register 12;

$C_5$ routes data from the A register 11 to the Y input of the arithmetic unit 9;

$C_6$ causes the contents of the B register 12 to be multiplied or divided by 10;

$C_7$ and $C_{7M}$ enable data from the arithmetic unit 9 to pass to the C register 13;

$C_8$ enables data from the A register 11 to pass to the X input of the arithmetic unit 9;

$C_9$ enables data to pass from the B register 12 to the X input of the arithmetic unit 9;

$C_{10}$ enables data to pass from the B register 12 to the Y input of the arithmetic unit 9;

$C_{11}$ enables data to pass from the C register 13 to the Y input of the arithmetic unit 9;

$C_{12}$ enables a 1 to be added to the Y input of the arithmetic unit 9 at $T_1$ time;

$C_{13}$ enables a 1 to be added to the Y input of the arithmetic unit 9 at both $T_8$ time and $T_{I2}$ time;

$C_{14}$ enables the $B_O$ output of the B register 12 to pass data to the Y input of the arithmetic unit 9;

$C_{15}$ operates on the arithmetic unit 9, $C_{15} = 1$ causing the unit to subtract, and $C_{15} = 0$ causing it to add;

$C_{16}$ enables data to pass from the arithmetic unit 9 to the register 14;

$C_{17}$ allows the contents of the register 14 to be multiplied or divided by 10; and $C_{18}$ is the up/down control signal, $C_{18} = 0$ being equivalent to "down" and $C_{18} = 1$ being equivalent to "up", down meaning that the timer 15 will count in the sequence $T_8$ to $T_O$, $T_{I2}$, $T_{I1}$, $T_B$.

It will be apparent that data will be supplied from one to another register always via the arithmetic unit, where it will be added to "zero". Moreover, data can be supplied from the actuator panel to the registers via a conductor 61 and from the arithmetic unit or the registers to the display output device 33 via a conductor 62.

Figure 10:
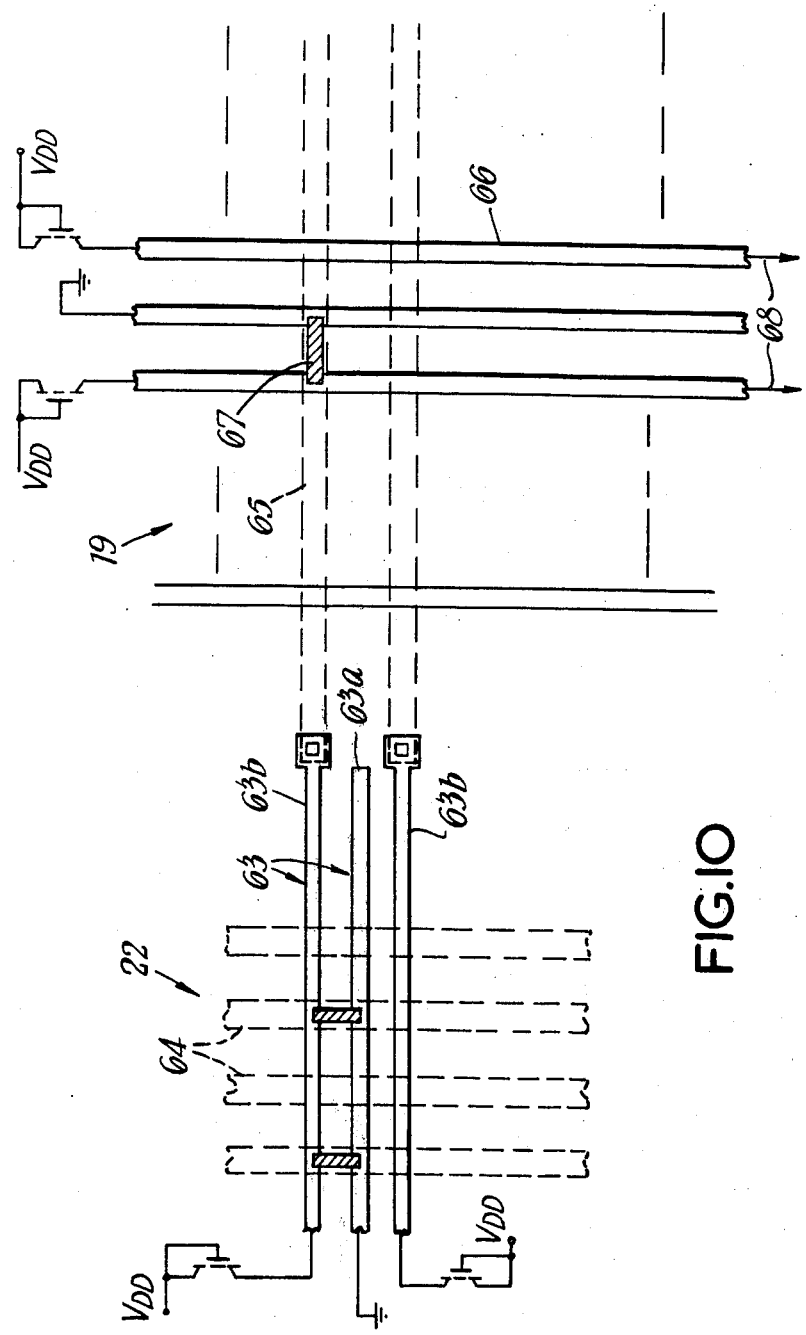
FIG. 10 shows a portion of an address decoder and a read-only memory of the calculator.

FIG. 10 shows how the address decoder 22 and the read-only memory 19 can be implemented in IGFET device form.

The decoder 22 has a plurality of "rows", defined by diffused strips 63 shown in full lines, over which extend a plurality of "columns" of conductors 64 four of which have been illustrated by dotted lines. These conductors 64 are connected to the command encoder 23 which supplies to the conductors a seven bit address. The shaded areas denote gate electrodes forming IGFET devices with the strips 63. Each gate electrode is connected to its overlying conductor 64. The strips 63 are arranged in groups of three, the centre one 63a of which is connected to earth, the outer ones 63b of which are connected to voltage $V_{DD}$. The strips 63b constitute the outputs of the decoder for addressing respective rows of the memory 19. Normally, the conductors 64 are energised to render all of the IGFET devices of the decoder conductive so that all the strips 63b are substantially at earth potential. If now, an appropriate 7 bit address is fed to the conductors 64, this will involve predetermined ones of the conductors being de-energised to render non-conductive the IGFET devices connected to those predetermined conductors. On one row of the decoder, all the IGFET devices will be affected, causing the voltage on the associated strip 63b to approach $V_{DD}$.

The memory is connected to the rows of strips 63b by rows of conductors 65 which overlie and are at right angles to diffused strips 66 which are arranged in groups of three as in the decoder 22. Gate electrodes 67 are disposed at predetermined crossing regions of the matrix so formed, so that signals will be emitted at predetermined outputs 68 when a conductor 65 is energised from one of the strips 63b of the decoder.

Figure 11:
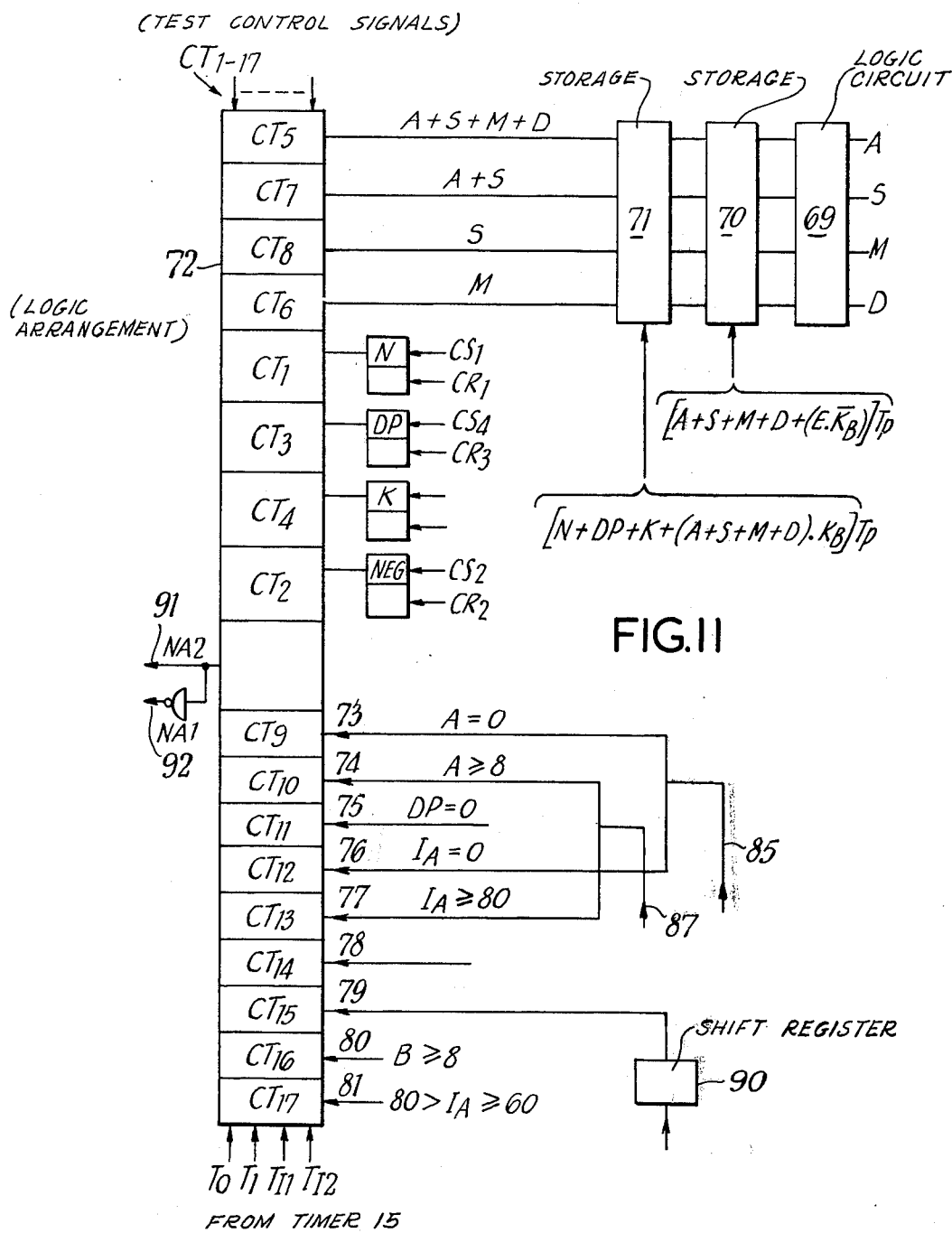
FIG. 11 is a block diagram of test logic.

FIG. 11 is a block diagram illustrating the functions carried out by the test logic 20. Input to the logic is obtained from the add (A) pad, the subtract (S) pad, the multiply (M) pad and the divider (D) pad of the actuator panel to a logic circuit 69 which forms the signals $(A + S + M + D)$, $(A + S)$, S and M. These signals are passed to a four-bit store 70 in $T_P$ time if at this time one of pads A, S, M and D is contacted or if the equals pad (E) is contacted when a bistable circuit K is not set. This bistable circuit K is set to deliver a signal $K_B$ when the constant (K) pad is contacted. The condition for entry to store 70 is therefore:

$$[A + S + M + D + (E . \overline{K_B})] T_P,$$

and accordingly logic circuit (not shown) for producing a signal representing this condition is connected to the store 70. The signals in store 70 are transferred to a four-bit store 71 in the subsequent $T_P$ time if, in that time, a number (N) pad, the decimal point (DP) pad or the constant (K) pad is contacted or if one of the A, S, M and D pads is contacted when the bistable circuit K is set. The condition for entry to store 71 is therefore:

$$[N + DP + K + (A + S + M + D) . K_B] T_P,$$

which is set up by logic circuitry (not shown).

The outputs $(A + S + M + D)$, $(A + S)$, S and M of the store 71 are fed as data inputs to a logic arrangement 72. Also fed to the arrangement 72 are the test control signals $CT_1$ to $CT_{17}$, these signals determining the existence or non-existence of the signals at respective inputs of the arrangement 72. The signals CT applying to the respective inputs are shown in the block of FIG. 11 which represents the logic arrangement 72. Additionally, the arrangement 72 receives signals $T_0$, $T_1$, $T_{I1}$ and $T_{I2}$ from the timer 15 to determine the times at which tests are made in the arrangement 72. Data is additionally fed to the logic arrangement 72 from the constant bistable circuit K, a "number" bistable circuit N, a "decimal point" bistable circuit DP and a "negative" bistable circuit NEG. These bistable circuits are set and reset by signals CS and CR respectively as indicated in FIG. 11, apart from bistable circuit K which is set from the K pad of the actuator panel and reset from the C pad. The circuit NEG is employed to store the data that a negative number has been created.

Finally additional data is fed to the logic arrangement 72 via inputs 73 to 81.

Figure 12:
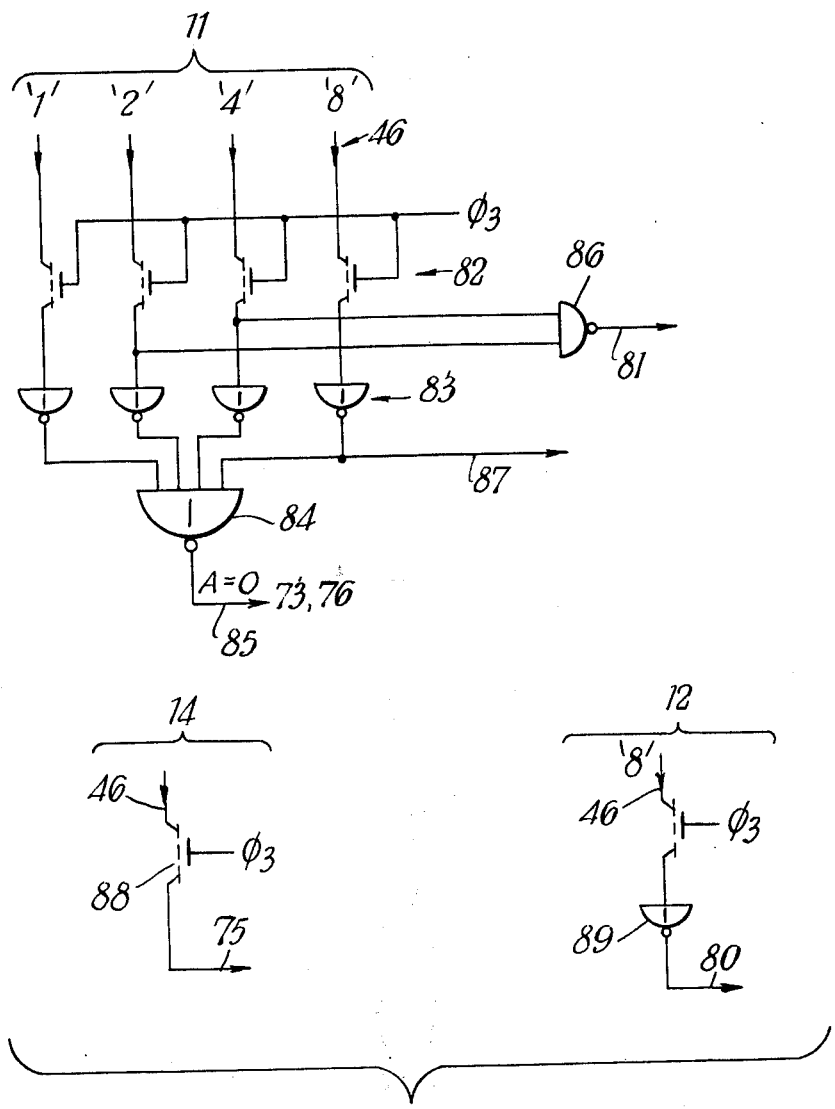
FIG. 12 is a diagram illustrating the derivation of test signals from the registers of the calculator.

Inputs 73 to 77 and 80 and 81 are derived from the A and B registers 11 and 12 and the DP register 14, in the manner shown in FIG. 12. From the A register 11, the lines 46 of the four BCD bits 1, 2, 4 and 8 are fed via switches 82 in $\phi_3$ time through inverters 83 to a NOR gate 84, the output 85 of which is delivered to inputs 73 and 76 of the logic arrangement 72. Input 73 will be tested at $T_0$ time to test whether or not the digit in the guard position is zero and input 76 will be tested at $T_I$ time to test whether or not the exponent is zero.

In addition, the bits from the 2 and 4 positions are fed via a NOR gate 86 to input 81 of the logic arrangement to test whether a bit is 6 or 7. This test is carried out at $T_{I1}$ time to test if the exponent is less than 80 and equal to or greater than 60. More particularly the test is used to discover if the exponent falls below 80. In the present embodiment, exponent storage from 80 to 99 is employed to represent in complement form exponents from −20 to −1. Thus, a change of exponent storage from 80 to 79 is a change of exponent from −20 to 79. Such a change might occur when an intermediate answer of zero is formed, zero having, validly, any value of exponent. However, if zero is given a large exponent by the calculators, bits of a number subsequently fed in for arithmetic combination with zero can be lost when the number is scaled to have the same exponent as the zero for addition or substraction. Accordingly, in the present embodiment, the exponent of zero is kept small, i.e. any transition of the exponent storage of zero from 80 to 79 will be detected by the test and will be compensated by adding one to the exponent.

In addition, an output 87 is taken from the 8 position and applied to the inputs 74 and 77 of the logic arrangement 72. In $T_0$ time, the data at input 74 will be tested on the occurrence of the test signal $CT_{10}$ to test whether the guard digit is $\geqslant 8$ and, at $T_{t1}$ time, the data at input 77 will be tested on the occurrence of test signal $CT_{13}$ to test whether the exponent is $\geqslant 80$.

From the DP register 14, the single output line 46 is fed by a switch 88 (FIG. 12) at $\phi_3$ time to input 75 of the arrangement 72; this input will be tested in $T_0$ time.

From the B register 12, the line 46 of the 8 bit position is connected in $\phi_3$ time through an inverter 89 (FIG. 12) to the input 80 of arrangement 72 and is tested in $T_0$ time.

Of the remaining inputs 78 and 79, input 78 is connected to the arithmetic unit 9 and receives a signal when the unit 9 produces a carry. Finally, input 79 receives the output of a one bit shift register 90 the input of which is connected to a data output line of each of the sections NA1 and NA2 of the memory 19. This data output line is in each case additional to the seven lines defining an address. The data givden by this additional output line will be defined in the following by preceding it with a comma, thus: ,1. For example, if one of the sections NA1 and NA2 supplies an address, say, "38" and has a digit 1 on its additional line, the output will be denoted "38,1". In the absence of the digit 1, the output will be denoted merely as 38.

The logic arrangement 72 has an output 91 which delivers a 1 if a positive test result is achieved and an output 92 which delivers a 1 in the absence of a positive result. The outputs 91 and 92 operate the switch 24 of FIG. 3.

Concluding this description of structural features, it is pointed out that the arithmetic unit 9 operates in binary fashion on receipt of BCD data and may have a conventional construction, albeit implemented in IGFET devices. Preferably, however, the unit 9 will be constructed according to our co-pending Application No.

The operation of the calculator will now be considered for the simple calculation of 0.02 divided by 30. Let it be assumed that the pads are operated in the following sequence "C", ".", "0", "2", "÷", "3", "0" and "=".

To assist in following the calculation reference will be made to the following table showing those of the programming steps relating to the present example of a calculation. In this table, the addresses are numbered 0, 1, 2 and so on and it is also necessary to know that the addresses 0, 1, 3 and 11 are those forced by command encoder 23 when signals appear respectively upon lines 26 to 29. The other symbols used in the table will be explained in the description of this example. Furthermore reference will be made to FIGS. 13 and 14 to show the states of the registers 11, 12, 13 and 14.

TABLE

| Address | Function | Test | NA2 | NA1 |
|---|---|---|---|---|
| 0 | A = O = DP, Reset NEG, N and DP | | | 68,1 |
| 1 | 0 + 1 at $T_8$, ans in DP, set DP | Number | 37 | 2 |
| 2 | A' = 0, set N, reset NEG | | | 37 |
| 3 | A × 10, DP × 10 | Number | 5 | 4 |
| 4 | A' = 0, DP = 0, set N, reset NEG | | | 5 |
| 5 | A = No at $T_8$ | A = 0 at $T_0$ | 8 | 6 |
| 6 | A ÷ 10, DP ÷ 10 | DP | 8 | 7 |
| 7 | $I_A + 1$ | Address | 40 | 8 |
| 8 | | DP = 0 at $T_0$ | 37 | 9 |
| 9 | DP ÷ 10 | Address | 33 | 10 |
| 10 | $I_A - 1$ | Address | 9,1 | 37 |
| A – 1 | Address | 9,1 | 37 | |
| 11 | | Number | 13 | 12 |
| 13 | | DP | 15 | 14 |
| 14 | 0 + 1 at $T_8$, ans in DP | Address | 61 | 15 |
| 15 | $I_A - 1$ | Address | 24 | 16 |
| 16 | A × 10, reset N and DP | $I_A \geqslant 80$ | 17 | 18 |
| 17 | | A = 0 at $T_0$ | 15 | 18 |
| 18 | $I_A + 1$, DP × 10 | DP = 0 at $T_0$ | 18 | 19 |
| 19 | A ÷ 10, DP ÷ 10 | A + S + M + D | 20 | 27 |
| 20 | 0 + 1 at $T_8$, ans in DP | B $\geqslant 8$ at $T_0$ | 21 | 22 |
| 22 | C' = B' | Constant | 23 | 62 |
| 23 | C' = B' | A + S | 38 | 64 |
| 24 | | A = 0 at $T_0$ | 61 | 25 |
| 25 | A ÷ 10 | Address | 32 | 27 |
| 26 | $I_A + 1$ | Address | 25,1 | 27 |
| 27 | B' = A' | Constant | 28 | 30 |
| 30 | C' = A' | Negative | 31 | 67 |
| 32 | 0 + 1 at $T_1$, ans in DP, reset N | $I_A \geqslant 80$ | 26,1 | 33 |
| 33 | | $I_A = 0$ | 34 | 10,1 |
| 34 | A × 10, DP × 10 | NEG | 35 | 36 |
| 36 | A ÷ 10, DP ÷ 10 | Address | 36 | 37 |
| 37 | Recirc A,B,C & DP, Display A | | | 37 |
| 52 | A ×10, B × 10, DP × 10 | Address | 56 | 53 |
| 56 | A − C, ans in A, $I_A - I_C$, ans in $I_B$ | Carry at $T_0$ | 58 | 57 |
| 57 | B + 1 at $T_8$ | | | 56 |
| 58 | A + C, ans in A | DP = 0 at $T_0$ | 52,1 | 59 |
| 59 | A' = B' | A = 0 at $T_0$ | 15,1 | 60 |
| 61 | A × 10, $I_A - 1$ | A = 0 at $T_0$ | 66 | 25 |
| 62 | B' = A' | | | 63 |
| 63 | A' = C' | Address | 70 | 23 |
| 64 | B = 0, set NEG | M | 48 | 56 |
| 67 | | Constant | 32 | 68 |
| 68 | B' = C' | Address | 37 | 32 |

The first step in the example is to clear the machine by contacting pad C, which generates the pulse $T_P$ to enable the command encoder 23 and supplies a signal on line 29 to cause the encoder 23 to force the address decoder 22 to row or address 0. As row 0 in the table shows, the address 0 of the memory 19 creates the functions of $A = 0 = DP$, and reset NEG, N and DP. $A = 0 = DP$ means that the A register 11 and DP register 14 are brought to zero content. The section 30 of the memory therefore emits control signals $C_{2I}$, $C_{2M}$ and $C_{16}$, which produce signals $C_2'$ and $C'_{16}$ to open the A and DP registers 11 and 14 to the arithmetic unit 9 (see FIGS. 5, 8 and 9). The arithmetic unit is supplied with no data so 0 s are entered at every bit position of registers 11 and 14. Reset NEG, N and DP means that bistables NEG, N and DP (FIG. 11) are reset, this involving the generation of signals $CR_1$ to $CR_3$ from row 0 of the memory 19 at section 31. No test signal CT is provided so the output 92 (FIG. 11) carries a 1 to select sections NA1, which, as the table shows at row C, delivers address "68, 1", which causes the selection of row "68" of the memory 19 and the setting of the address register 90 (FIG. 11) by the digit 1.

At address 68 the function $B' = C'$ is specified. This means that the whole content of the B register 12 is to be made equal to the whole content of the C register 13, the dash applied to the designation of the register referring to the whole content. In the absence of the dash, the mantissa content is referred to, e.g. A is equivalent to the mantissa of the A register. When reference is made to the exponent content, the designations such as $I_A$ are used. The instruction $B' = C'$ is effected by control signals $C_{4M}$, $C_{4I}$ and $C_{11}$. As FIG. 9 shows, $C_{11}$ causes the content of the C register to be applied to the Y inputs of the unit 9, where it is added to 0 as no signal is present at the X input. $C_{4M}$ and $C_{4I}$ produce $C_4'$ which opens the B register to receive the content of the arithmetic unit 9. The contents of the B and C registers are of no concern, however, at this stage in the calculation.

Also at row 68, test signal $CT_{15}$ is produced to test the address, i.e. the content of address register 90 at inputs 79 (FIG. 11). The register 90 contains the bit 1, so the test is positive and output 91 of arrangement 72 is energised to select section NA2 of the memory 19 which provides the next address 37.

The function created by address 37 is "Recirc A, B, C and DP, Display A" meaning that the A, B, C and DP registers have their contents recirculated and the A register has its content displayed. The only control signal emitted is $C_8$. Accordingly, the devices 48 of the registers open to cause data to recirculate in the registers, i.e. to reinforce the stored data, and the content of the A register is fed to the X input of the arithmetic unit 9 (where it is added to 0) and thence to the display on line 62. The next address selected is 37 again, so that the memory remains at address 37, to recirculate data and display the A register data, until a new external command is supplied.

In the present example, the next operation is contact with the DP pad, which generates $T_P$ and drives the address decoder to memory address 1. Control signals $C_{13}$ and $C_{16}$ will be generated, $C_{13}$ causing a 1 to be supplied in $T_8$ time to the Y input of the unit 9 and $C_{16}$ opening the DP register 14 to the unit 9. Accordingly a 1 will be placed in the $T_8$ address of the DP register, thereby fulfilling the function $1 + 0$ at $T_8$, ans in DP, i.e. add one (at the Y input) to 0 (at the X input) in $T_8$ time and supply answer to DP register 14. Test signal $CT_1$ will also be provided to test number bistable circuit N; this bistable circuit has not been set so that test is negative and NA1 will supply the next address 2. In addition signal $CS_4$ will be emitted to set the DP bistable circuit. At the next address 2, signals $C_2'$, $CS_1$ and $CR_2$ are emitted to set the A register to zero, to set the number bistable circuit N and reset the negative bistable circuit NEG. Subsequently, the programme jumps to address 37 which is again the display mode. The contents of the A and DP registers are now as shown at line $a$ of FIG. 13.

When the 0 pad is contacted, a signal indicating number is generated, which in turn causes $T_P$ to be generated and drives the address decoder 22 to address 3 at which control signals $C_3$ and $C_{17}$ are generated to multiply the contents of the A and DP registers by 10. Line $b$ of FIG. 13 shows the states of the registers at this stage. $CT_1$ is also emitted to test the bistable circui N, which gives a positive result and a selection of the NA2 section address which is 5. At address 5 $C_1$ is generated, which produces signal $C_2'$ at $T_8$ time to enter the number supplied into the $T_8$ address of the A register 11. Test signal $CT_9$ is also produced to test input 73 (FIG. 11) at $T_0$ time. As the guide digit at the $T_0$ address is a zero the result is positive and the programme proceeds to NA2 address 8, which produces only the test signal $CT_{11}$ to test input 75 (FIG. 11) in $T_0$ time. The $T_0$ address of the DP register 14 is 0, so the test is positive and the programme proceeds again to the display adddresss 37.

The pad 2 is now contacted and again the number signal is generated to address row 3 to multiply the A and DP registers by ten and select the next address 5. At address 5, the number supplied, i.e. 2, is added to the $T_8$ address of the A register and the programme proceeds via address 8 to the display address 37. The content of the A and DP registers is now as shown at line $c$ of FIG. 13.

Subsequently, the ÷ pad is contacted, forcing the programme to address "11", which scales the number (0.02) entered. The programme proceeds via addresses 11 and "13" to address "15" at which the exponent portion of the A register is reduced by 1 ($I_A - 1$) from "00" to "99" and the next address "16" is selected. At address 16, the mantissa of the A register is multiplied by 10, the bistable circuits N and DP are reset and the address "17" is selected to test the guard digit of the A register, resulting in selection of address 15 again. The programme will then cycle through addresses 15, 16 and 17 until the state shown in line $d$ of FIG. 13 is reached at address 17. The test is then negative as 2 is in the A register guard position and the next address of "18" is selected, causing the exponent of the A register to be added to 1 and the DP register to be multiplied by 10. The programme will then recycle at address 18 until the condition shown in line $e$ of FIG. 13 is reached, when the DP register at $T_0$ will not be 0. Accordingly next address "19" will be selected. At address 19, the A and DP registers 11 and 14 are divided by 10, giving the result at line $f$ of FIG. 13. The A register then stores the number in floating point form, i.e. $2 \times 10^{-2}$, the $-2$ data being given by the complement of 2 with respect to 100 in the exponent location. The DP register also shows the correct decimal point location for the floating point representation.

At address 19 the "$A+S+M+D$" signal is tested but a negative result is obtained as the signal is still in store 70 (FIG. 11). Accordingly the next address is "27", at which the whole content of B register 12 is made equal to the whole content of the A register ($B' = A'$) and the "constant" bistable circuit K is tested. The negative result causes address "30" to be selected, at which the C register is also made equal to the A register ($C' = A'$)

and at which the address of "67" is selected as the bistable circuit NEG has not been set. The test at address 67 selects address 68, making $B' = C'$ and selecting address "32". At address 32, 1 is placed in the $T_1$ address of the DP register, the number bistable circuit N is reset, and the A register exponent is tested for a negative exponent, i.e. $I_A \geq 80$ at input 77 of arrangement 72 in FIG. 11. Accordingly, address "26, 1" is selected, causing a 1 to be entered ito the register 90 and the exponent of the A register to be increased by one. The A and DP register contents are now as shown at line g of FIG. 13, it being remembered that the A register content at line f is stored in the B and C registers. The positive test at address "26" selects address "25" and again inputs a 1 to register 90. At address 25 the A register is divided by ten and the programme steps to address 32. The programme cycles between addresses 32, 26 and 25 until the condition at line h of FIG. 13 is reached, when, at address 32, the test ($I_A \geq 80$) becomes negative and address "33" is selected. The test $I_A = 0$ being positive, address "34" is reached and the A and DP registers are multiplied by 10 and the NA1 address "36" selected. Accordingly, the A and DP registers are divided by 10 and the address tested at input 79 (FIG. 11). The negative results select address "37", so the content of the A register, still as shown in decimal form at line h of FIG. 13, is displayed as "0.020...".

The 3 pad is then contacted, which selects address 3 and causes the signal $(A + S + M + D)$ in store 70 to be passed to store 71 from which it is fed to the arrangement 72 (FIG. 11). The programme steps through addresses 3, 4 and 5, to enter the number (3) into the $T_8$ position of the A register 11, and then to addresses 8 and 37 to display the number (3). Subsequent contacting of the 0 pad again drives the programme to address 3 and in this case a positive test result (because of the "set N" function at address 4) steps the programme through addresses 3, 5, 8 and 37 to advance the stored number (3) by one digit in the A register, insert the new number (0) in the $T_8$ position of the A register and display the resulting number (30). The states of the A and DP registers are now as shown at line i of FIG. 13.

The = pad is now contacted to address row 11 of the memory 19. The number bistable circuit N is in its "set" state so the programme steps to address 13 and then, as the DP bistable circuit has not been set, to address 14 which introduces into the DP register 14 the appropriate bit to represent the decimal point of the number concerned (30.0). The condition of the A and DP registers is now as shown at line j of FIG. 13. Proceeding via address 15 the number in the A register is scaled until the result shown at line k of FIG. 13 is produced. At this stage, address 19 is effective and a positive test result is produced as the signal $(A + S + M + D)$ has reached the arrangement 72 (FIG. 11). Accordingly, the programme steps to address "20", so that a 1 is entered into the $T_8$ position of the DP register 4, and then to address "22".

Figure 14:
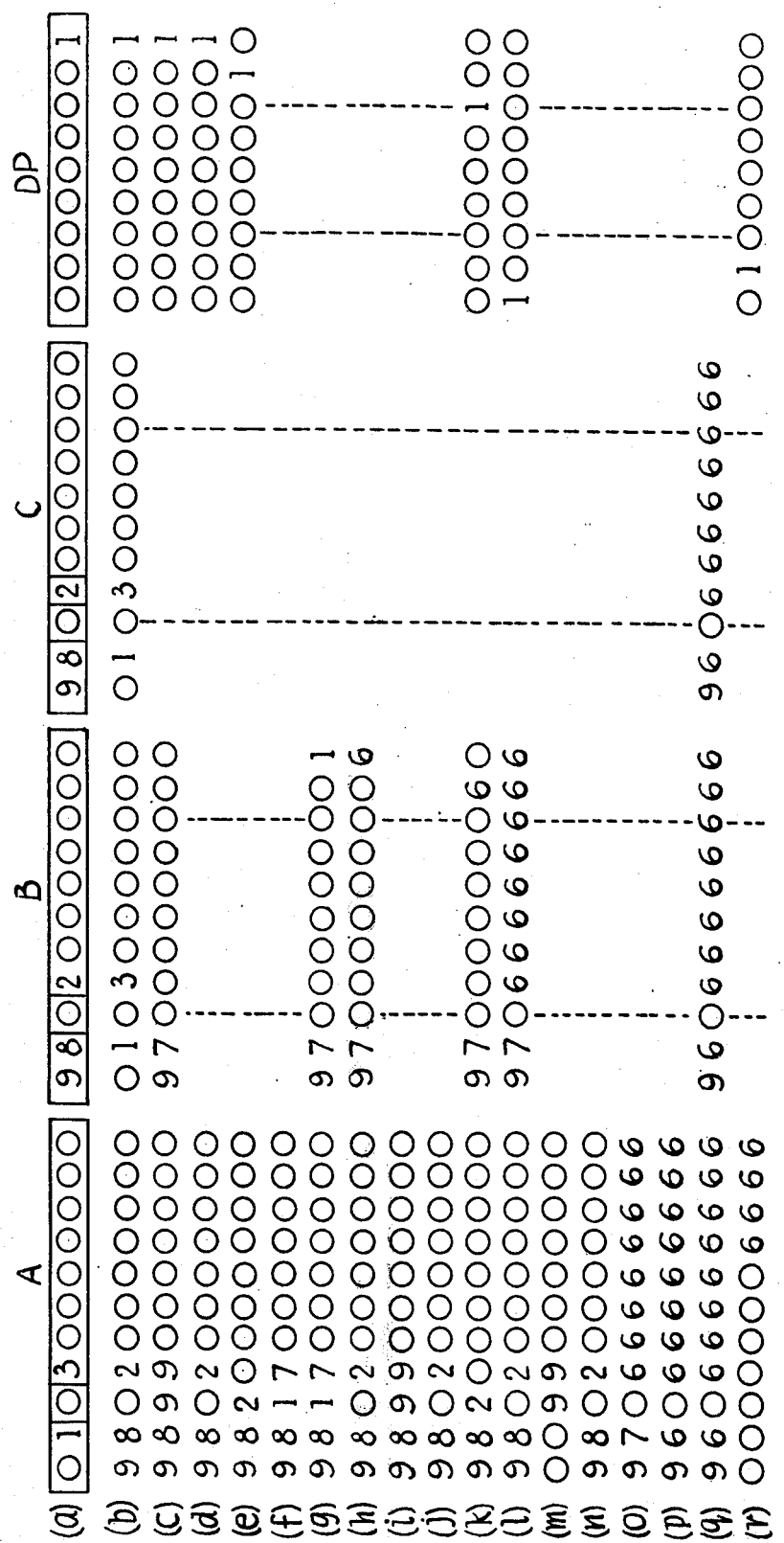

Reference will now be made to FIG. 14 which shows the states of the A, B, C and DP registers. Line a shows the states when address 22 has been reached. From address 22, the programme jumps to address "62", then to address "63", and then to address "23" to transfer the content of the A register to the B register, the content of the C register to the A register and the content of the B register to the C register giving the condition shown at line b of FIG. 14. At address 23, the test of (A+S) is negative (showing that a multiplication or division operation is involved) and address "64" is selected, setting the B register to zero, setting the bistable circuit NEG and testing for a signal M from the store 71 (FIG. 11). A negative test result initiates a division routine commencing at address "56". The result of the subtraction operation determined by address 56 is shown at line c of FIG. 14. A carry is formed by the subtraction $(A-C)$ so the positive test result selects address "58". At address 58 the mantissa of the C register is added to the mantissa in the A register, giving the condition at line d of FIG. 14, and the programme steps back to address "52", where the A, B and DP registers have their mantissa contents multiplied by ten (line e of FIG. 14) and address 56 is selected again. The $(A-C)$ and $(I_A - I_C)$ subtractions are effected again (line f of FIG. 14) but this time with no carry, so that the programme proceeds to address 57, where a 1 is added to the $T_8$ position of the B register (line g of FIG. 14) and the programme returns to address 56. The programme will cycle between addresses 56 and 57, adding 1 each time to whatever is in the $T_8$ position of the B register, until a carry is again formed. Thus, the state shown at line h of FIG. 14 will eventually be produced at address 57 and the state at line i at the subsequent address 56, when a carry is formed. The programme therefore steps to address 58 to add the mantissas of the A and C registers, the answer being in the A registers, as shown at line j of FIG. 14. The A, B and DP registers are then multiplied by 10 (address 52 and line k of FIG. 14) and the programme cycles again between addresses 56 and 57. This sequence is repeated several times, each time a 6 being formed in the $T_8$ position of the B register. Eventually, therefore, the states of the registers will be as shown at line l of FIG. 14 after reaching address 57. Subsequently, a carry is developed at address 56 (line m of FIG. 14) and address 58 is reached (line n of FIG. 14). The DP register at the $T_0$ position containing a 1, the programme steps to address "59" and the A register is supplied with the whole content of the B register (line o of FIG. 14) and the programme steps back to address 15 as the A register at its $T_0$ or guard position contains a zero. The exponent of the A register is thus reduced by one to "96" and the programme passes via address "24" to address "61" where the mantissa of the A register is multiplied by 10 and its exponent reduced by one, putting a digit into the guard position and thus giving a negative test which selects address 25. At this address, the mantissa of the A register is divided by ten. The programme proceeds to address "26" (line p of FIG. 14) and "27", giving the answer to the problem in floating point mole in both the A and B registers. Address "30" follows, to transfer the answer to the C register also (line q of FIG. 14).

Finally, the A and DP registers are operated upon to descale the A register content so that it is in a fixed-point form for display, the programme utilising the sequence of addresses: 67, 68, 32, 26, 25, 32, 26, 25, and so on until the exponent in the A register reaches C0, (r in FIG. 14) giving a negative test result at address 32 and directing the programme to address 33, address 34 and then address 36. At address 36, the programme is directed to the display address 37 to display the answer 0.0006666.

In the constant mode, the constant function can be performed with all four arithmetic operations. The results are achieved by a combination of control logic associated with the input functions and the basic programme stored in the memory 19. The constant operation has the additional ability to operate on the result achieved from a previous constant operation. This enables numbers to be raised to positive or negative powers or constant values can be repeatedly added or subtracted. Also the constant mode of operation causes the programme to effectively reverse the normal sequence of events. This is extremely useful in performing calculations where the denominator is more complex than the numerator or, alternatively, where a complex number is being subtracted from a simpler number.

Finally, it is to be noted that the described calculator has an "overfill" and an "underfill" capability.

Overfill arises because, whilst the mantissa capacity is eight digits, a number with a mantissa greater than eight digits can have its eight most significant digits stored with the correct expondent up to $10^{79}$. For example, if the number 12345678912 is supplied, the A register will store it as $1.2345678 \times 10^{10}$. This is achieved by way of addresses 5, 6 and 7 of the for programmer. Thus, when the digit 9 is fed in, the initial digit 1 will pass into the $T_0$ or guard position of the register and cause a negative test result at address 5 to select address 6. At address 6 the A register mantissa is divided by 10, thereby losing the digit 9. The address 7 is then selected to add one to the exponent in the A register to compensate fro the division of the A register by ten to maintain the correct exponent significance.

"Underfill" arises when a number having more than eight decimal places occurs. As already mentioned, if a number such as $2.0 \times 10^{-12}$ is fed in, the display will show zero, but, owing to "underfill", the mantissa of 2.0 is stored within the calculator. This is achieved via addresses 8, 9 and 10. When a number such as $2.0 \times 10^{-2}$ is fed to the A register, a point will be reached when a 1 exists in the guard position of the decimal poit register. This is detected by the test signal of address 8 to select address 9 at which the 1 is shifted back to the $T_1$ position of the decimal point register. Then address 10 is selected to reduce the exponent of the A register by one to maintain the correct exponent value.

I claim:

1. A floating-point calculator circuit comprising: input means for the input of numerical data to the circuit; a plurality of registers including write and read lines and including a plurality of digit storage locations for storing numerical data in BCD form and each of said registers being a random-access static memory; an arithmetic unit for operating on numerical values stored in said registers; controllable data paths connecting said input means and said arithmetic unit to said registers; reversible-direction timing means for sequentially and reversibly addressing the digit storage locations of each of said registers; and distinct digit transfer means for controlling data shifts in each of said registers, the respective digit transfer means being coupled to the write and read lines for transferring a digit from one of the digit storage locations to one of the adjacent ones of the digit storage locations for multiplication and division by ten operations, the direction of transfer depending upon the momentarily existing direction of operation of the timing means.

2. A calculator comprising:
numerical and command data input means;
numerical data output means;
an arithmetic unit including numerical data input means and including a control a control input and being selectively operable to effect addition and subtraction of numbers supplied at the numerical data input means in dependence upon a control signal level at the control input;
a plurality of numerical-storage registers including write and read lines and each including a plurality of digit storage positions for storing digits in a BCD form and each of which is a random-access static memory; reversible direction timing means for sequentially and reversibly addressing the digit storage positions of each of said registers, the timing means including a control input to receive a control signal the level of which defines the direction of addressing;
a number routing means comprising a plurality of switches including control inputs for control signals, connected to the input means, output means, the arithmetic unit and the registers, for directing numbers from the input means and the arithmetic unit to said registers, from the registers to the input means of the arithmetic means and from the registers to the output means;
distinct digit transfer means for each of said registers and each having a control input to receive a control signal to operate the digit transfer means, the digit transfer means being connected to the write and read lines of the registers for transferring a digit from one of said digit storage locations to one or another of the adjacent ones of said digit storage locations for multiplication and division by 10 operations, the direction of transfer depending upon the momentarily existing direction of operation of the timing means;
and control means having input connection coupled to the input means, output connections coupled to the control inputs of the arithmetic unit, of the number routing arrangement, of the timing mans and of the control logic means of the registers, and means for selectively supplying sets of control signals at the output connections in dependence upon the data at the input connections, the sets defining sets of operations of the arithmetic unit, the number rotating means, the timing means and the control logic means to effect arithmetic operations in floating-point mode on numerical data supplied at the input means, the means for selectively supplying comprising logic means connected to the timing means for issuing some of said control signals, for controlling the entry of data into at least some of the registers, in dependence upon register addressing signals of the timing means so as to define a first, exponent, storage zone and a second, mantissa, storage zone in each of the at least some registers, the largest value of exponent storable in the first storage zone being greater than the number of digit storage locations in the second zone.

3. A calculator as claimed in claim 2, wherein said registers are cynamic registers and said control logic means is operable for circulating stored digits.

4. A calculator as claimed in claim 2, comprising test logic coupled to actuate the control means and wherein at least one of said numeral-storage registers has mantissa storage for $n$ digits and an additional, guard digit, storage position such that, on the supply of $n + 1$ mantissa digits to the register, one of said digits will enter said guard digit storage position and be sensed by said test logic which will then actuate the control means to produce a set of said control signals to increase by one the exponent storage value and divide by ten the mantissa so that the correct exponent, but only the n most significant mantissa digits, will be retained.

5. A calculator as claimed in claim 2, wherein the said calculator includes means operable in a multiplication mode to allow digits to overflow from one to another of said numeral-storage registers to increase the mantissa storage capacity for an arithmetic product during its formation.

6. A calculator as claimed in claim 2, comprising an instruction input means for holding a number stored in said calculator as a constant factor for subsequent arithmetic operations of addition, subtraction, multiplication and division.

7. A calculator as claimed in claim 6, wherein the instruction input means is coupled to the control means for selecting control signals effective to reverse the function of two of said numeral-storage registers such that said number retained as a constant factor is processed as if it were the second of two numbers entered into said calculator.

8. A calculator as claimed in claim 2, and comprising a decimal point register in the form of a random-access memory having bit positions sequentially addressable by said timing means for storing decimal point positions.

9. A calculator as claimed in claim 8, comprising test logic coupled to actuate the control means and wherein sad decimal point register has a guard digit position into which a digit will be entered when a number having at least a predetermined number of decimal places is supplied to one of said numeral-storage registers, the existence of said digit in said guard digit position being sensed by the test logic which will then actuate the control means to produce a set of control signals to reduce by one the exponent storage value in said numeral-storage register and to change by one decimal place the decimal point position storage in said decimal point register in the direction away from the guard digit position so as to retain in the combination of the store values of said registers the correct decimal significance.

10. A calculator as claimed in claim 2, wherein said sets of control signals include control signals defining one of said sets of operations to operate said decimal point register in conjunction with one of said numeral-storage registers for supplying output data in fixed-point form.

11. A calculator as claimed in claim 10, wherein said one of said sets of operations retains said output data in floating-point form in another of said numeral-storage registers.

12. A calculator as claimed in claim 11, wherein said sets of control signals include control signals emitted when data is input to said calculator to couple said one numeral-storage register to said input means to act as an input register 13. A calculator as claimed in claim 2, wherein the means for selectively supplying sets of control signals is a read-only memory.

14. A calculator as claimed in claim 13, wherein said read-only memory has a plurality of addresses at which bits are stored defining routing operations for said routing arrangement and defining addresses representing next effective addresses.

15. A calaculator as claimed in claim 14, further comprising a self-addressing means for said read-only memory to enable said read-only memory to address itself according to said next effective address which it provides for itself.

16. A calculator as claimd in claim 15, comprising test logic means and wherein said read-only memory comprises means for defining two alternative ones of said next effective addresses and means for defining test signals for initiating tests in said test logic means to determined which of the two alternative next addresses is to be effective.

17. A calculator as claimed in claim 16, wherein said test logic means includes means for making tests upon signals determined by command input data and instructions to said calculator and by the states at predetermined digit position of said registers.

18. A calculator as claimed in claim 2, wherein said registers, said timing means, said arithmetic unit, said routing means and said control means are in integrated circuit form.

19. A calculator as claimed in claim 18 comprising, and wherein said integrated circuits exist on a single semi-conductor substrate.

20. A calculator as claimed in claim 19, wherein the active devices of said integrated circuits are insulated-gate field-effect devices.

21. A calculator as claimed in claim 20, comprising three insulated-gate field effect devices and wherein said registers are dynamic registers and include control logic means for recirculating stored digits, and wherein the bits of storage of said registers are indicated by said three insulated-gate field-effect devices, one of said insulated-gate field effect devices being a storage device, another of said insulated-gate field effect devices being a writing device and the third of said insulated-gate field effect devices being a reading device.

22. A calculator as claimed in claim 19, wherein said timing means defines timing signal paths extending through a zone of said substrate containing said registers substantially at right angles to output data signal paths for data from said registers.

23. A calculator as claimed in claim 19, further comprising test logic means and wherein the means for selectively supplying control signals comprises read-only memory comprising means for defining two alternative next addresses for said arrangement and means for defining test signals for initiating tests in said test logic to to determine which of said two alternative next addresses is to be effective, and wherein said timing signal paths of said timing means extend beyond said registers to said test logic to determine test times within said test logic.

24. A calculator as claimed in claim 23, said read-only memory defining test signal paths extending to said test logic means substantially at right angles to said timing signal paths of said timing means.

25. A calculator as claimed in claim 24, wherein said read-only memory provides control signal paths extending to said routing means substantially at right angles to data signal paths from said registers to said routing means.

26. A calculator as claimed in claim 25, wherein said read-only memory has a tapered physical form such that said test signal paths extend substantially parallel to said control signal paths within the read-only memory and are spaced apart at an edge region of said read-only memory in a direction at an angle to the direction in which said test signal paths extend from said edge region to said test logic means.

* * * * *